(12) United States Patent
Venkatraman et al.

(10) Patent No.: US 8,035,161 B2
(45) Date of Patent: Oct. 11, 2011

(54) SEMICONDUCTOR COMPONENT

(75) Inventors: Prasad Venkatraman, Gilbert, AZ (US);
Gordon M. Grivna, Mesa, AZ (US);
Francine Y. Robb, Fountain Hills, AZ
(US); George Chang, Tempe, AZ (US);
Carroll Casteel, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/790,987

(22) Filed: Jun. 1, 2010

(65) Prior Publication Data
US 2010/0237409 A1    Sep. 23, 2010

Related U.S. Application Data

(62) Division of application No. 11/737,923, filed on Apr. 20, 2007, now Pat. No. 7,767,529.

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)
*H01L 29/00* (2006.01)

(52) U.S. Cl. ........... 257/331; 257/510; 257/E29.257

(58) Field of Classification Search .......... 257/331, 257/510, E29.257
See application file for complete search history.

(56) References Cited

U.S. PATENT DOCUMENTS

| | | | | |
|---|---|---|---|---|
| 6,309,929 B1 * | 10/2001 | Hsu et al. | ...... | 438/270 |
| 6,855,986 B2 * | 2/2005 | Hsieh et al. | ...... | 257/339 |
| 2003/0042556 A1 | 3/2003 | Gajda et al. | | |
| 2005/0199952 A1 * | 9/2005 | Hsieh et al. | ...... | 257/339 |

OTHER PUBLICATIONS

Webster's New Collegiate Dictionary, G. & C. Merriam Co., 1973, p. 1274.
Merriam-Webster OnLine, http://www.merriam-webster.com/, accessed on Jan. 15, 2010. Pages showing the definition of the word "under" as a preposition and as an adverb.

* cited by examiner

*Primary Examiner* — David S Blum
(74) *Attorney, Agent, or Firm* — Rennie William Dover

(57) ABSTRACT

A semiconductor component resistant to the formation of a parasitic bipolar transistor and a method for manufacturing the semiconductor component using a reduced number of masking steps. A semiconductor material of N-type conductivity having a region of P-type conductivity is provided. A doped region of N-type conductivity is formed in the region of P-type conductivity. Trenches are formed in a semiconductor material and extend through the regions of N-type and P-type conductivities. A field oxide is formed from the semiconductor material such that portions of the trenches extend under the field oxide. The field oxide serves as an implant mask in the formation of source regions. Body contact regions are formed from the semiconductor material and an electrical conductor is formed in contact with the source and body regions. An electrical conductor is formed in contact with the backside of the semiconductor material.

19 Claims, 4 Drawing Sheets

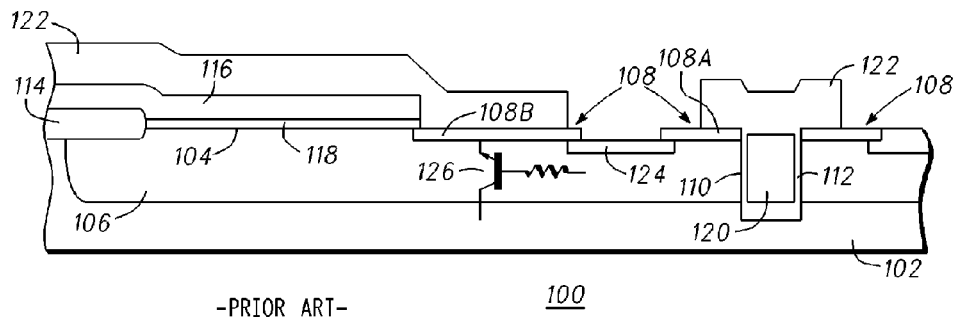
FIG. 1 -PRIOR ART-
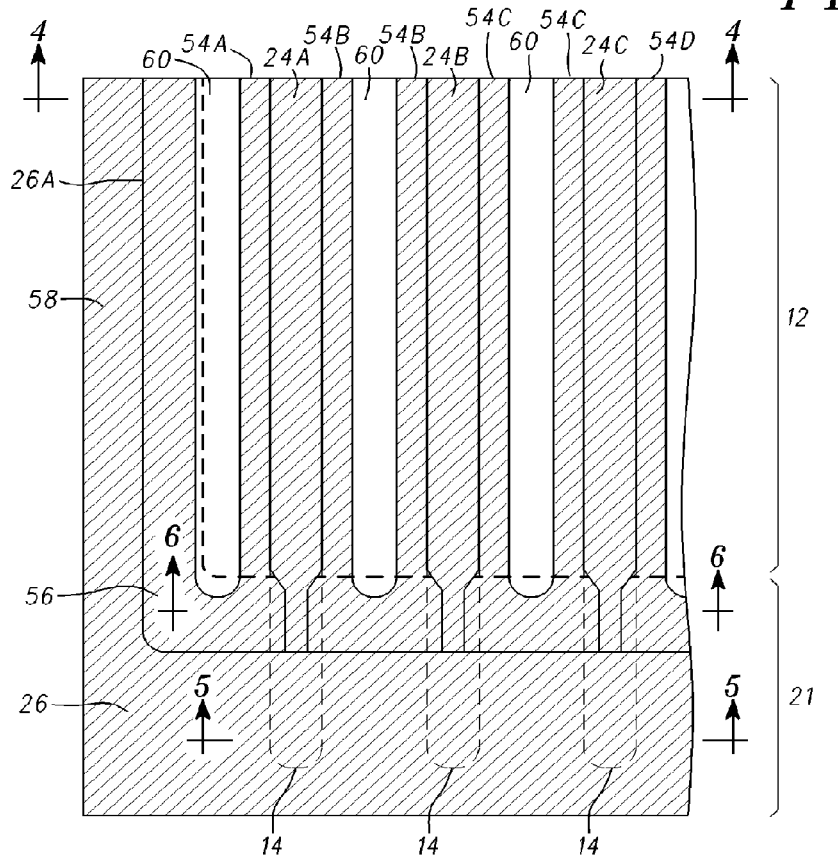
FIG. 2

SEMICONDUCTOR COMPONENT

The present application is a division of application of prior U.S. patent application Ser. No. 11/737,923 filed on Apr. 20, 2007, now U.S. Pat. No. 7,767,529, which is hereby incorporated herein by reference in its entirety, and priority thereto for common subject matter is hereby claimed.

FIELD OF THE INVENTION

The present invention relates, in general, to semiconductor components and, more particularly, to power switching semiconductor components.

BACKGROUND OF THE INVENTION

Metal-Oxide Semiconductor Field Effect Transistors ("MOSFETs") are a common type of power switching device. A MOSFET device includes a source region, a drain region, a channel region extending between the source and drain regions, and a gate structure adjacent to the channel region. The gate structure includes a conductive gate electrode layer adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

The manufacture of MOSFETs includes several masking steps for depositing impurity materials into a semiconductor substrate of a power MOSFET, etching portions of the semiconductor substrate, etching portions of a dielectric material, etching portions of a conductive material, etc. Increasing the number of masking steps increases the cost of manufacturing the power MOSFET. However, manufacturers of power MOSFETs typically increase the number of masking steps for the sake of improving performance. FIG. 1 illustrates a masking step used in the manufacture of a power MOSFET. What is shown in FIG. 1 is a prior art power MOSFET 100 having active and peripheral areas and comprising a semiconductor substrate 102 having a major surface 104 and a doped region 106 of P-type conductivity extending from surface 104 into substrate 102. Doped region 106 is also referred to as a body region of power MOSFET 100. A doped region 108 of N-type conductivity extends from surface 104 into a portion of doped region 106. A trench 110 having sidewalls and a floor extends from surface 104 through doped regions 106 and 108 into semiconductor substrate 102. A layer of dielectric material 112 is disposed along the sidewalls and floor of trench 110.

A field oxide region 114 is formed from semiconductor substrate 102. A layer of polysilicon 116 is formed over field oxide region 114 and extends over doped region 106. Polysilicon layer 116 is isolated from doped region 106 by a layer of dielectric material 118. In addition, polysilicon 120 is formed over dielectric layer 112. Polysilicon 120 serves as a gate conductor and dielectric layer 112 serves as a gate dielectric. A layer of dielectric material 122 is formed on polysilicon layer 116 and gate polysilicon 120. An opening is formed in doped region 108 to expose a portion of doped region 106. A doped region 124 of P-type conductivity is formed in the exposed portion of doped region 106. Doped region 124 serves as a body contact. The formation of the opening in doped region 108 creates doped sub-regions 108A and 108B of N-type conductivity. Doped sub-region 108A serves as a source region of power MOSFET 100. It should be noted that there is a large distance between body contact 124 and polysilicon layer 116 and that the portion of semiconductor substrate 102 in this region will be doped with the impurity material that forms doped region 108 in the absence of a source block mask.

FIG. 1 illustrates the formation of power MOSFET 100 without a source block mask. In the absence of a source block mask, a parasitic bipolar transistor 126 is formed near the edges of the active area because of the large distance between body contact 124 and polysilicon layer 116. More particularly, parasitic bipolar transistor 126 is formed from substrate 102, doped region 106, and doped region 108B. Parasitic bipolar transistor 126 degrades the Unclamped Inductive Switching ("UIS") performance of power MOSFET 100. Thus, the manufacturers of Power MOSFETs include a source block mask to block impurity materials from doping the portion of doped region 108 that becomes doped portion 108B. Although the additional masking step precludes formation of a parasitic bipolar transistor, it increases the cost of manufacturing power devices such as, for example, a power MOSFET.

Accordingly, it would be advantageous to have a power semiconductor device such as, for example, a power MOSFET with an increased resistance to the formation of a parasitic bipolar transistor and a method for manufacturing the power semiconductor device. It would be of further advantage for the power semiconductor device to be cost efficient to manufacture.

BRIEF DESCRIPTION OF THE DRAWINGS

The present invention will be better understood from a reading of the following detailed description, taken in conjunction with the accompanying drawing figures in which like reference characters designate like elements and in which:

FIG. 1 is a cross-sectional view of a prior art semiconductor component during manufacture;

FIG. 2 is a top view of a portion of a power semiconductor component in accordance with an embodiment of the present invention;

DETAILED DESCRIPTION

Figure 3:
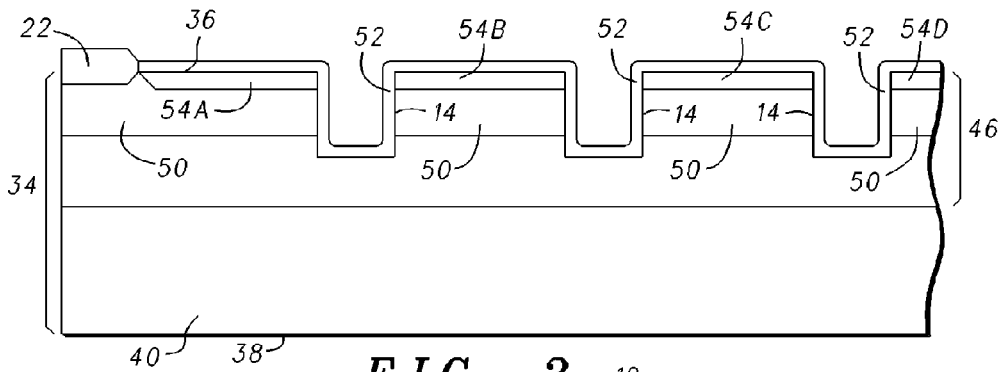
FIG. 3 is a cross-sectional view of the power semiconductor component of FIG. 2 taken along the area indicated by section line 4-4 but at an earlier stage of manufacture than that of FIG. 2.

Generally, the present invention provides a semiconductor component having an increased resistance to the formation of a parasitic bipolar transistor and a method for manufacturing the semiconductor component using at least one less masking step. In accordance with an embodiment of the present invention, a source block mask is eliminated by extending the trenches to be under the field oxide regions. The field oxide blocks the source implant precluding the need for a separate masking step.

FIG. 2 is a layout of a power Metal Oxide Semiconductor Field Effect Transistor ("MOSFET") 10 in accordance with an embodiment of the present invention. Power MOSFET 10 has an active area 12 and a peripheral area 21. What is shown in FIG. 2 is a portion of active area 12 and a portion of peripheral area 21. Active area 12 has a plurality of trenches 14 that are laterally spaced apart from each other by openings 60. Trenches 14 extend from active area 12 to peripheral area 21. The portions of trenches 14 in peripheral area 21 extend under field oxide 22. Trenches 14 are also referred to as trench structures. Source regions will be formed adjacent to trenches 14 and body regions will be formed adjacent to the source regions and adjacent to a field oxide 22 in the peripheral portions of active area 12. Field oxide 22 is formed in peripheral area 21 of power MOSFET 10 and is shown in FIGS. 3-8. More particularly, portions 24A, 24B, and 24C of the polysilicon layer are disposed in trenches 14 and a portion 26 of the polysilicon layer is disposed on field oxide 22. A lateral boundary of polysilicon portion 26 is identified by a solid line indicated by reference character 26A. FIG. 2 also illustrates a photoresist layer 58 that is over polysilicon portion 26 and over a portion of a dielectric layer 56. It should be understood that a dielectric layer 52 is between trenches 14 and portions 24A, 24B, and 24C of the polysilicon layer. Dielectric layer 52 is not shown in FIG. 2. Doped regions 54A, 54B, 54C, and 54D are shown and described with reference to FIG. 3.

FIG. 3 is a cross-sectional view of power MOSFET 10 during manufacture in accordance with an embodiment of the present invention. It should be noted that FIG. 3 is a cross-sectional view taken along section line 4-4 of FIG. 2, but at an earlier stage of manufacture than the portion of power MOSFET 10 depicted in FIG. 2. What is shown in FIG. 3 is a semiconductor material 34 having major surfaces 36 and 38. By way of example, semiconductor material 34 comprises a lightly doped N-type conductivity semiconductor layer 46 disposed on a highly doped N-type bulk semiconductor substrate 40. Substrate 40 has a bottom or back surface 38 that serves as a bottom surface of semiconductor material 34. Surface 38 is also referred to as a backside. Preferably, layer 46 is an epitaxial layer. The resistivity of layer 46 generally is greater than about 0.1 Ohm-centimeters ("Ω-cm") and preferably is less than about 10 Ω-cm. The resistivity of substrate layer 40 typically is less than about 0.01 Ω-cm to provide a low resistance conduction path for the current that flows through power MOSFET 10 and to provide a low resistance electrical connection to a drain conductor that is formed on bottom surface 38 of semiconductor material 34. It should be noted that semiconductor material 34 is not limited to being an epitaxial layer disposed on a semiconductor substrate. Semiconductor material 34 may be a semiconductor substrate without an epitaxial layer or it may be comprised of stacked epitaxial layers disposed on a semiconductor substrate.

A P-type conductivity doped layer 50 is formed in semiconductor layer 46. Preferably, layer 50 is boron and has a concentration ranging from about $1 \times 10^{16}$ atoms per cubic centimeter (atoms/cm$^3$) to about $1 \times 10^{18}$ atoms/cm$^3$. Techniques for forming doped layer 50 are known to those skilled in the art. It should be noted that the term "P-type conductivity" is used interchangeably with the term "P conductivity type" and the term "N-type conductivity" is used interchangeably with the term "N conductivity type."

Field oxide 22 is formed from semiconductor layer 46 and trenches 14 are formed in semiconductor layer 46. Preferably, trenches 14 extend from surface 36 through doped layer 50 into semiconductor layer 46. A gate oxide layer 52 is formed over a portion of surface 36 and on trenches 14. Doped regions 54A, 54B, 54C, and 54D of N-type conductivity are formed in doped layer 50. Preferably, doped regions 54A-54D are formed by implanting arsenic into doped layer 50 and have a concentration ranging from about $1 \times 10^{19}$ atoms/cm$^3$ to about $1 \times 10^{21}$ atoms/cm$^3$. An advantage of the present invention is that doped region 54A abuts field oxide 22 which acts as a masking layer, and eliminates the need for a photo mask to block the implant that forms doped region 54A from extending to the edge of polysilicon portion 26 (shown in FIG. 2).

Figure 4:
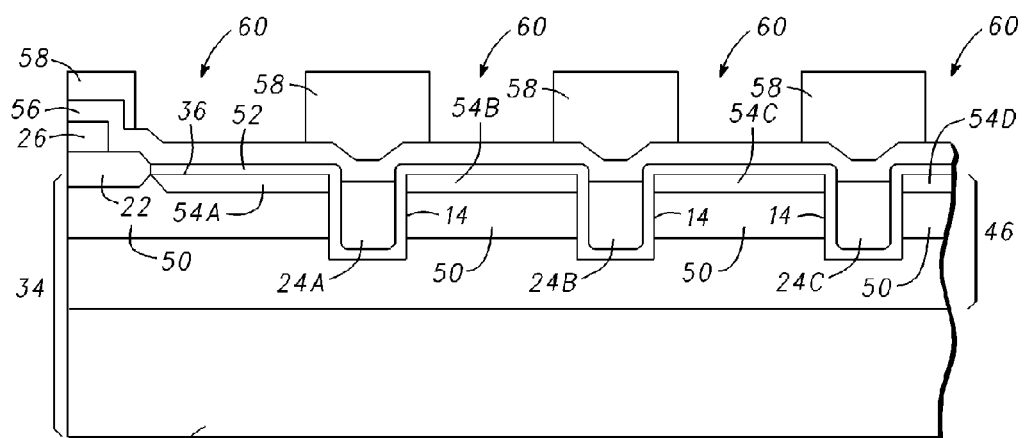
FIG. 4 is a cross-sectional view of the semiconductor component of FIG. 2 taken along section line 4-4.

Referring now to FIG. 4, a layer of polysilicon having a thickness ranging from about 2,000 Angstroms ("Å") to about 10,000 Å is formed on field oxide 22, dielectric layer 52, and in trenches 14. It should be noted that FIG. 4 is a cross-sectional view of semiconductor component 10 taken along section line 4-4 of FIG. 2. A layer of photoresist (not shown) is formed on the polysilicon layer and patterned to form a masking structure that protects the portions of the polysilicon layer over field oxide 22 and leaves the remaining portions of the polysilicon layer exposed. Although the portions of the polysilicon layer formed in trenches 14 are shown as filling trenches 14, it should be understood that there may be a gap in the portions of the polysilicon within one or more of trenches 14. The exposed portions of the polysilicon layer are etched using, for example, an anisotropic reactive ion etch leaving portions 24A, 24B, and 24C of the polysilicon layer in trenches 14 and portion 26 over field oxide 22. The photoresist layer is removed.

Still referring to FIG. 4, a layer of dielectric material 56 having a thickness ranging from about 3,000 Å to about 10,000 Å is formed on portions 24A, 24B, 24C, and 26 of the polysilicon layer and on the exposed portions of dielectric layer 52. By way of example, dielectric layer 56 is oxide formed by the decomposition of tetraethylorthosilicate, commonly referred to as a TEOS layer. A layer of photoresist is disposed on TEOS layer 56 and patterned to form masking structures 58 and openings 60 that expose portions of TEOS layer 56 that are between trenches 14 and between trenches 14 and field oxide 22. Masking structures 58 are also referred to as photoresist masking structures.

Figure 5:
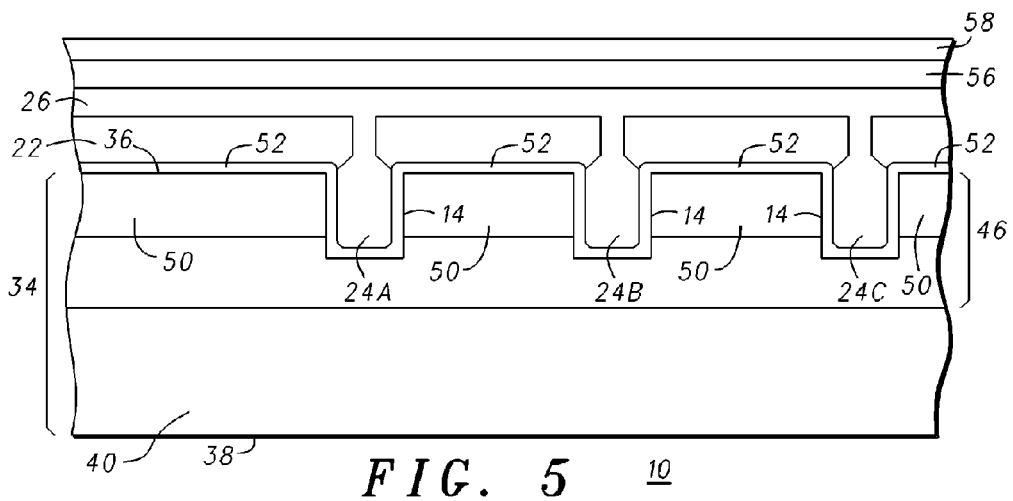
FIG. 5 is a cross-sectional view of the semiconductor component of FIG. 2 taken along section line 5-5.

FIG. 5 is a cross-sectional view of semiconductor component 10 taken along section line 5-5 of FIG. 2 and illustrates trenches 14 and portions 24A, 24B, and 24C of the polysilicon layer extending under field oxide region 52. FIG. 5 further illustrates portion 26 of the polysilicon layer disposed on field oxide region 22, dielectric layer 56 disposed on portion 26, and masking structure 58 disposed on dielectric layer 56.

Figure 6:
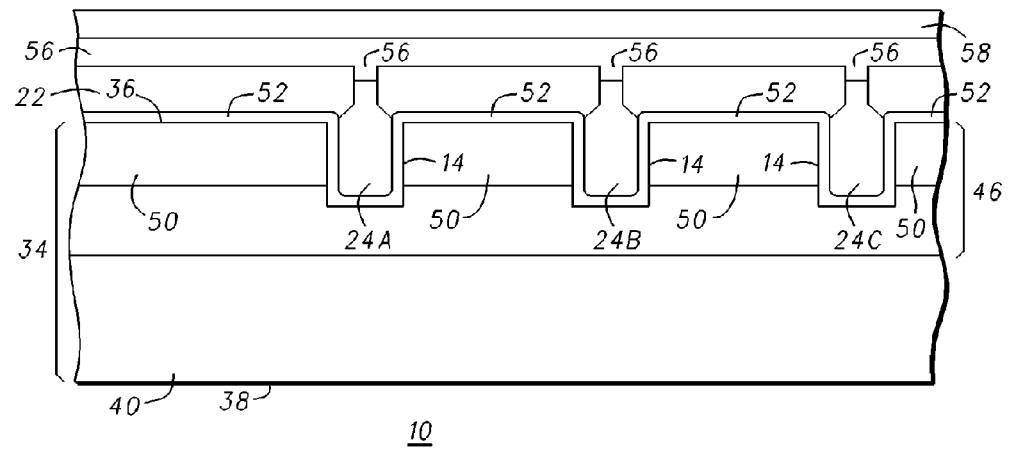
FIG. 6 is a cross-sectional view of the semiconductor component of FIG. 2 taken along section line 6-6.

FIG. 6 is a cross-sectional view of semiconductor component 10 taken along section line 6-6 of FIG. 2 and illustrates trenches 14 extending under field oxide region 22 and portion 26 of the polysilicon layer that is disposed on field oxide region 22. Dielectric layer 56 is disposed on portions 24A, 24B, and 24C of the polysilicon layer and masking structure 58 is disposed on dielectric layer 56.

Figure 7:
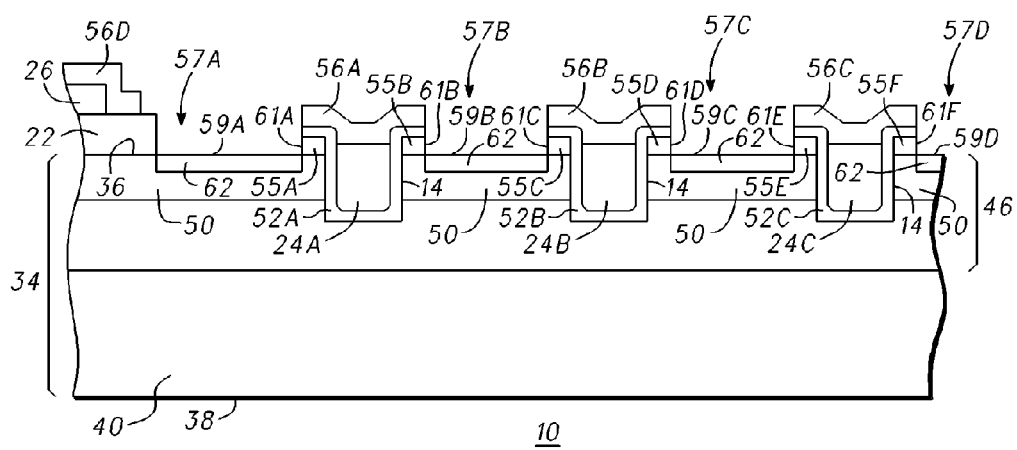
FIG. 7 is a cross-sectional view of the semiconductor component of FIG. 4 at a later stage of manufacture.

Referring now to FIG. 7, the exposed portions of TEOS layer 56 are anisotropically etched using, for example, a reactive ion etch to expose portions of dielectric layer 52, which are then anisotropically etched to expose portions of doped regions 54A-54D. The exposed portions of doped regions 54A-54D are anisotropically etched to form trenches 57A, 57B, 57C, and 57D in epitaxial layer 46 that expose portions of doped layer 50. Trenches 57A-57D have floors 59A-59D, respectively, and sidewalls. More particularly, trench 57A has a sidewall 61A, trench 57B has sidewalls 61B and 61C, trench 57C has sidewalls 61D and 61E, and trench 57D has sidewall 61F. After the reactive ion etch, portions 52A, 52B, and 52C of dielectric layer 52 remain below polysilicon portions 24A, 24B, and 24C in trenches 14, respectively. Portions 56A, 56B, and 56C of TEOS layer 56 remain over portions 52A, 52B, and 52C, respectively, and portion 56D remains over field oxide 22 and portion 26 of the polysilicon layer. In addition, portion 55A of doped region 54A, portions 55B and 55C of doped region 54B, portions 55D and 55E of doped region 54C, and portion 55F of doped region 54D remain and will serve as the source regions of power MOSFET 10. Thus, sidewalls 61A-61F are sidewalls of source regions 55A-55F, respectively.

Still referring to FIG. 7, doped regions 62 are formed in doped layer 50. In accordance with one embodiment, doped regions 62 are formed by implanting an impurity material of P-type conductivity such as, for example, boron into the exposed portions of doped layer 50. Preferably, doped regions 62 have a concentration ranging from about $1\times10^{18}$ atoms/cm$^3$ to about $1\times10^{20}$ atoms/cm$^3$.

Figure 8:
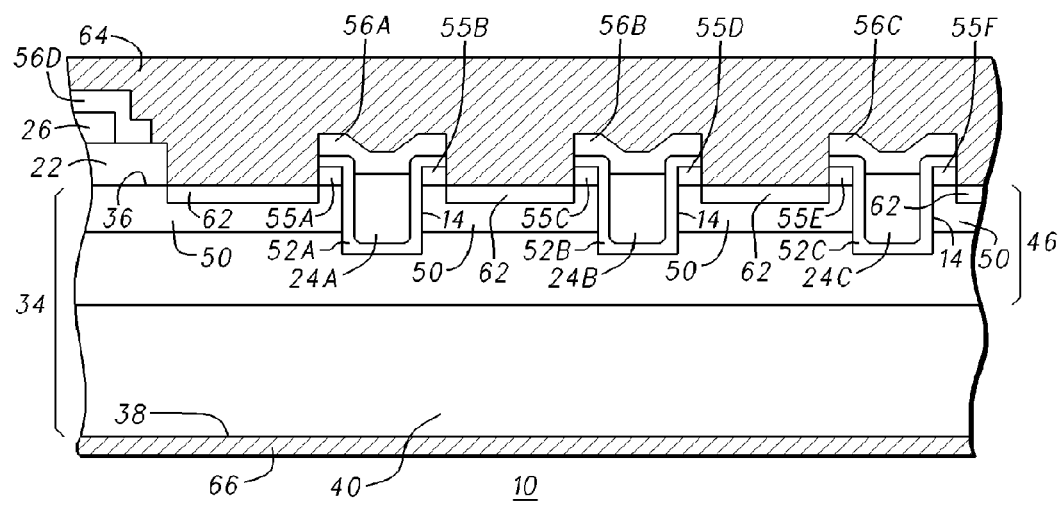
FIG. 8 is a cross-sectional view of the semiconductor component of FIG. 7 at a later stage of manufacture.

Referring now to FIG. 8, a conductor 64 is formed in contact with the exposed portions of surface 48 and source regions 55A-55F. More particularly, conductor 64 contacts doped regions 62 and sidewalls 61A-61F of source regions 55A-55F, respectively. Conductor 64 typically is a metal such as, for example, aluminum. Conductor 64 serves as a source, gate, and body contact for semiconductor component 10. A conductor 66 is formed in contact with surface 38 and serves as a drain contact for semiconductor component 10. Conductor 66 typically is a metal such as, for example, aluminum.

By now it should be appreciated that a semiconductor component with an increased resistance to the formation of a parasitic bipolar transistor and a method for manufacturing the semiconductor component using fewer masking steps has been provided. Eliminating masking steps lowers the cost of manufacturing the semiconductor component without sacrificing its performance.

Although certain preferred embodiments and methods have been disclosed herein, it will be apparent from the foregoing disclosure to those skilled in the art that variations and modifications of such embodiments and methods may be made without departing from the spirit and scope of the invention. For example, the field oxide could be formed before forming the trenches. It is intended that the invention shall be limited only to the extent required by the appended claims and the rules and principles of applicable law.

What is claimed is:

1. A power semiconductor component, comprising:
   a semiconductor material having first and second major surfaces, an active area, and a peripheral area;
   a layer of impurity material of a first conductivity type extending from the first major surface into the semiconductor material a first distance;
   a first trench extending from the first major surface into the semiconductor material and from the active area to the peripheral area;
   a field oxide in the peripheral area, the field oxide over a portion of the first trench that extends to the peripheral area;
   a layer of polysilicon disposed over a portion of the field oxide; and
   semiconductor material disposed in the first trench.

2. The power semiconductor component of claim 1, further including an opening in a portion of the semiconductor material between the first trench and the peripheral area, the opening having a sidewall, a floor, and extending from the first major surface into the semiconductor material a second distance, the second distance greater than the first distance.

3. The power semiconductor component of claim 2, further including a doped region extending from the floor of the opening into the semiconductor material.

4. The power semiconductor component of claim 3, further including:
   a first conductor in contact with the doped region and the sidewall of the opening; and
   a second conductor in contact with the second major surface.

5. The power semiconductor component of claim 1, further including:
   a second trench extending from the first major surface into the semiconductor material and from the active area to the peripheral area;
   semiconductor material disposed in the second trench;
   an opening in a portion of the semiconductor material between the first trench and the second trench, the opening having a sidewall, a floor, and extending from the first major surface into the semiconductor material a second distance, the second distance greater than the first distance; and
   a doped region extending from the floor of the opening into the semiconductor material.

6. A semiconductor component, comprising:
   a semiconductor material having first and second major surfaces, the semiconductor material comprising an epitaxial layer disposed on a semiconductor substrate and having an active area and a peripheral area;
   a plurality of trench structures in the semiconductor material, wherein the plurality of trench structures extend vertically from the first major surface into the epitaxial layer and laterally from the active area to the peripheral area; and
   a field oxide formed from the peripheral area, wherein a portion of the plurality of trenches extends under the field oxide.

7. The semiconductor component of claim 6, further including:
   a layer of impurity material of a first conductivity type extending from the first major surface into the semiconductor material a first distance;
   a layer of polysilicon over the active and the peripheral areas and patterned to have a first portion over a first portion of the field oxide and a second portion over at least one of the plurality of trench structures;
   a layer of dielectric material having a first portion over the first portion of the layer of polysilicon and a second portion over the second portion of the layer of polysilicon; and
   a trench in the layer of semiconductor material, the trench having a floor and a sidewall and extending from the major surface into the semiconductor material a second distance.

8. The semiconductor component of claim 7, further including a doped region of a second conductivity type extending from the floor of the trench into the semiconductor material.

9. The semiconductor component of claim 8, further including a first conductor in contact with the second doped region and the sidewall of the trench and a second conductor in contact with the second major surface.

10. The semiconductor component of claim 6, wherein the semiconductor material comprises a layer of impurity material of a first conductivity type extending from the first major surface into the semiconductor material a first distance, and further including:
   a layer of polysilicon over the active and the peripheral areas having a first portion over a first portion of the field oxide layer and a second portion in a first trench of the plurality of trenches, and a third portion of the layer of polysilicon in a third trench of the plurality of trenches;

a layer of dielectric material over at least the first, second, and third portions of the layer of polysilicon; and a trench in the layer of semiconductor material between the first and second trenches, the trench having a floor, first and second sidewalls, and extending from the major surface of the exposed portion of the layer of impurity material into the semiconductor material a second distance, wherein the floor exposes a second portion of the semiconductor material and wherein the second distance is greater than the first distance and the first and second sidewalls expose a portion of the layer of impurity material of the first conductivity type.

11. The method of claim 10, further including a doped region of a second conductivity type in the second portion of the semiconductor material.

12. A semiconductor component, comprising:

a semiconductor material having a major surface;

one or more trenches that extend from the major surface into the semiconductor material; and a field oxide over a peripheral region of the semiconductor material, wherein the one or more trenches extends under the field oxide.

13. The semiconductor component of claim 12, wherein the semiconductor material comprises:

a substrate; and an epitaxial layer formed on the substrate.

14. The semiconductor component of claim 12, further including a first portion of a polysilicon layer in the one or more trenches and a second portion of the polysilicon over a portion of the field oxide.

15. The semiconductor component of claim 14, further including a first doped region of a first conductivity type in a first portion of the semiconductor material and a second doped region of a second conductivity type in a second portion of the semiconductor material.

16. The semiconductor component of claim 15, further including a layer of dielectric material over the first portion of the polysilicon layer and over the second portion of the polysilicon layer, wherein the layer of dielectric material is absent from the region that is between the field oxide and a first trench of the one or more trenches.

17. The semiconductor component of claim 16, wherein the field oxide is absent from a region that is adjacent the first trench.

18. The semiconductor component of claim 14, further including:

a first doped region of a first conductivity type in the semiconductor material, wherein the one or more trenches extend further from the major surface into the semiconductor material than the first doped region; and a second doped region of a second conductivity type in a second portion of the semiconductor material.

19. The semiconductor component of claim 14, further including a first metal contact in contact with the first and second doped regions and a second metal contact in contact with the second surface of the semiconductor material.

* * * * *